United States Patent
Wong et al.

(10) Patent No.: US 7,759,741 B2
(45) Date of Patent: Jul. 20, 2010

(54) METHOD AND APPARATUS FOR FORMING NICKEL SILICIDE WITH LOW DEFECT DENSITY IN FET DEVICES

(75) Inventors: Keith Kwong Hon Wong, Wappingers Falls, NY (US); Robert J. Purtell, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 12/049,595

(22) Filed: Mar. 17, 2008

(65) Prior Publication Data

US 2008/0164540 A1 Jul. 10, 2008

Related U.S. Application Data

(62) Division of application No. 11/163,038, filed on Oct. 3, 2005, now Pat. No. 7,456,095.

(51) Int. Cl.
*H01L 29/76* (2006.01)
*H01L 29/94* (2006.01)
*H01L 31/00* (2006.01)

(52) U.S. Cl. ................. 257/382; 257/388; 257/E29.156
(58) Field of Classification Search ................. 257/382, 257/388, E29.156
See application file for complete search history.

(56) References Cited

U.S. PATENT DOCUMENTS 6,451,693 B1 * 9/2002 Woo et al. .................... 438/682
6,534,394 B1   3/2003 Cooney, III et al.
6,693,001 B2   2/2004 Nishihara et al.
6,737,341 B1   5/2004 Yamamoto et al.
6,838,363 B2   1/2005 Wieczorek et al.
6,867,130 B1 * 3/2005 Karlsson et al. ............. 438/655
2003/0122164 A1 * 7/2003 Komatsu .................... 257/219

OTHER PUBLICATIONS

Written Opinion of the International Seraching Authority—Form PCT/ISA/237—International Application No. PCT/US2006/023964—Applicant file reference FIS920050184.

* cited by examiner

*Primary Examiner*—Asok K Sarkar
(74) *Attorney, Agent, or Firm*—Yuanmin Cai

(57) ABSTRACT

A method and an apparatus are provided in which non-directional and directional metal (e.g. Ni) deposition steps are performed in the same process chamber. A first plasma is formed for removing material from a target; a secondary plasma for increasing ion density in the material is formed in the interior of an annular electrode (e.g. a Ni ring) connected to an RF generator. Material is deposited non-directionally on the substrate in the absence of the secondary plasma and electrical biasing of the substrate, and deposited directionally when the secondary plasma is present and the substrate is electrically biased. Nickel silicide formed from the deposited metal has a lower gate polysilicon sheet resistance and may have a lower density of pipe defects than NiSi formed from metal deposited in a solely directional process, and has a lower source/drain contact resistance than NiSi formed from metal deposited in a solely non-directional process.

11 Claims, 5 Drawing Sheets

METHOD AND APPARATUS FOR FORMING NICKEL SILICIDE WITH LOW DEFECT DENSITY IN FET DEVICES

CROSS REFERENCE TO RELATED APPLICATION

This application is a divisional application of a U.S. patent application Ser. No. 11/163,038, entitled "METHOD AND APPARATUS FOR FORMING NICKEL SILICIDE WITH LOW DEFECT DENSITY IN FET DEVICES", and filed Oct. 3, 2005.

FIELD OF THE INVENTION

This invention relates to the manufacture of advanced semiconductor devices, and particularly to improving manufacturability of high performance field effect transistors (FETs) in CMOS integrated devices, where nickel silicide is included in the structure of the FETs.

BACKGROUND OF THE INVENTION

Metal silicides have come into use in the manufacture of advanced FET devices, in order to limit the increase in sheet resistance as processing linewidths decrease. In particular, the silicon in the upper portion of the gate structure of an FET and the area of silicon in the source/drain region adjacent the gate are often converted to a silicide. In a typical silicidation process a metal layer is first deposited over the FET structure, after which the structure is annealed to cause formation of a silicide where the metal is in contact with silicon; unreacted metal is subsequently removed. FIG. 1A illustrates a FET structure 10 formed on a substrate 1 and having a pair of FET gate structures (having gate material 11, 12 over gate dielectric 13, 14) with spacers 15, 16 on the sides of the gate material. A blanket metal layer 17 is deposited on the structure; heat treatment will cause metal in layer 17 to combine with gate material 11, 12 and silicon in the source/drain regions 2 of the substrate. Regions of silicide material 18 are thus formed as shown in FIG. 1B.

Nickel silicide offers a less severe increase in sheet resistance with decreasing linewidth when compared with other metal silicides (e.g. cobalt silicide). For this reason nickel silicide is widely considered to be the silicide material of choice in the manufacture of FET structures where the gate linewidth is 65 nm or below. The temperature in the silicidation heat treatment process is controlled so that the low-sheet-resistance phase NiSi is formed, as opposed to the high-resistance $NiSi_2$.

Unfortunately, the conventional nickel silicide formation process is susceptible to so-called pipe defects—unwanted outward growths of silicide in the substrate, particularly sideways growth under the spacers. Pipes 19 are schematically illustrated in FIG. 1B. The material in the pipes may be either NiSi or $NiSi_2$.

It is known that the density of pipe defects in nickel silicide is influenced by the type of metal deposition process that is used. Deposition processes (and the tools in which they are performed) are generally either directional (collimated) or non-directional (non-collimated). Each deposition process results in a distinct profile of the resulting silicide. Profiles of deposited metal on a pair of gates (after the spacers 15, 16 have undergone a height-reducing etching or "pulldown" process) are illustrated in FIGS. 2A and 2B. A collimated metal deposition process, in which the metal atoms travel in substantially straight paths normal to the substrate surface, causes a buildup of metal 21 on the top surface of the gate structure and substantially uniform metal coverage on the substrate surface 21b (including the surface between the gates); only a thin layer of metal is deposited in region 21a on the side walls of the gate structure (FIG. 2A). In contrast, a non-collimated metal deposition process causes metal 22 to deposit on both the top and sides of the gate structure, so that the metal thickness on the side walls in region 22a is approximately that of the metal on top of the gate (FIG. 2B). In the non-collimated process the gate structure, spacers and deposited metal on top of the gate structure cause shadowing of the substrate close to the spacers, so that metal coverage on the surface (e.g. in region 22b) may be incomplete. This effect is more pronounced as the aspect ratio of the region increases (e.g. as the distance between gate structures decreases).

Profiles of silicides formed as a result of these processes are illustrated in FIGS. 2C and 2D. When a collimated deposition process is used (see FIG. 2C), the nickel silicide 23 has a reduced thickness in region 23a on the sides of the gate structure, and uniform coverage adjacent to the spacers in the source/drain region 23b. In contrast, when a non-collimated deposition process is used (see FIG. 2D), the nickel silicide 24 has greater thickness in region 22a on the side of the gate but poor coverage in region 22b adjacent to the spacers.

Studies have shown that the density of pipe defects is affected by the degree of directionality of the deposition process. For example, deposition of Ni in a non-directional (non-collimated) process may result in a lower nickel silicide pipe defect density than deposition of a similar thickness of nickel in a directional (collimated) process. In addition, numerous workers in the field have noted that the silicide formed after a non-collimated metal deposition has a gate polysilicon sheet resistance about 30% lower compared to silicide formed after a collimated deposition process. This is due to the greater thickness of metal deposited on the side of the gate in the non-collimated process. On the other hand, in the non-collimated metal deposition process the poor coverage of silicide in the source/drain region leads to high contact resistance in that region.

It therefore is highly desirable to combine the best features of the collimated and non-collimated nickel deposition processes. Specifically, it is desirable to have non-directional deposition on top of the gate structure while having directional deposition in the source/drain region. One possible approach would be to perform the nickel deposition in two steps: (1) deposit part of the desired thickness in a process chamber using a conventional, non-collimated process; (2) deposit the remaining thickness in another chamber (for example, in an Advanced Low Pressure Source tool from Applied Materials, Inc.) using a collimated process. The two process chambers would need to be linked so that the substrate is not exposed to air. This solution is expensive, both in terms of equipment and increased substrate handling.

In order to realize the potential for NiSi in FET manufacturing, there is a need for a nickel deposition process and tool which integrate directional and non-directional process steps, so that the resulting silicide has minimal sheet resistance and avoids pipe defects.

SUMMARY OF EMBODIMENTS OF THE INVENTION

The present invention addresses the above-described need by providing a method of making an FET device on a substrate, in which two process steps are performed in the same chamber: a first step of depositing metal on the device in a non-directional process; and a second step of depositing metal on the device in a directional process. A first plasma is formed in the process chamber in the first step, and a secondary plasma is formed in the second step. The secondary plasma is formed in the interior of an annular electrode (in the case of nickel deposition, preferably a Ni ring) connected to an RF generator. The first plasma causes material to be removed from a target, while the secondary plasma increases the ion density of the material. A substrate holder is provided which may be electrically biased, so that ions are attracted to the substrate in a direction normal thereto.

A silicide (e.g. NiSi) formed from the deposited metal may be included in a gate structure and/or in source/drain regions of an FET device. A silicided gate formed by the method of the present invention has a lower effective sheet resistance than a silicided gate formed from metal deposited in a solely directional process. Silicided source/drain regions formed in accordance with the invention likewise have lower source/drain contact resistance than silicided source/drain regions formed from metal deposited in a solely non-directional process. The metal is preferably Ni but may be any of Ni, Ti, W, Mo, Co, Pt, Nb or alloys thereof.

The deposition process may be characterized by a degree of collimation of the metal deposition, with a density of silicide pipe defects in accordance therewith.

According to another aspect of the invention, an apparatus is provided for performing the above-described process. The apparatus includes a holder for the substrate, a target disposed opposite the substrate holder, an annular electrode disposed between the substrate holder and the target, a first RF generator connected to the electrode for forming a secondary plasma in the interior thereof, and a second RF generator connected to the substrate holder for electrically biasing the substrate. Material from the target (e.g. Ni) is deposited non-directionally on the substrate in the absence of the secondary plasma and in the absence of electrical biasing of the substrate, and deposited directionally on the substrate on condition of the secondary plasma being present and on condition of the substrate being electrically biased. The secondary plasma increases the ion density of the material, and the biasing of the substrate causes ions from the secondary plasma to travel in a direction normal to the substrate, thereby causing directional deposition of the material on the substrate.

According to an additional aspect of the invention, a structure formed on a substrate includes first and second regions of metal silicide. In the first region the metal silicide is disposed on top of the structure and on an adjacent sidewall; in the second region the metal silicide is disposed on the substrate adjacent to the sidewall so that a surface of the metal silicide is in contact with the sidewall. The thickness of the metal silicide in the second region decreases with decreasing distance from the sidewall. The regions of metal silicide may be discontinuous.

The thickness of metal silicide on the sidewall in the first region may be substantially equal to the thickness on the top. The thickness of metal silicide in the second region may be less than that of metal silicide in the first region.

According to a further aspect of the invention, an FET gate structure formed on a substrate includes a portion of gate material having a top and a sidewall, a spacer adjacent the sidewall, a first region of metal silicide on top of the gate material, and a second region of metal silicide on the substrate and in contact with the spacer. The first region and the second region are discontinuous, and the thickness of the metal silicide in the second region decreases with decreasing distance from the spacer.

DETAILED DESCRIPTION OF EMBODIMENTS OF THE INVENTION

Figure 1A:
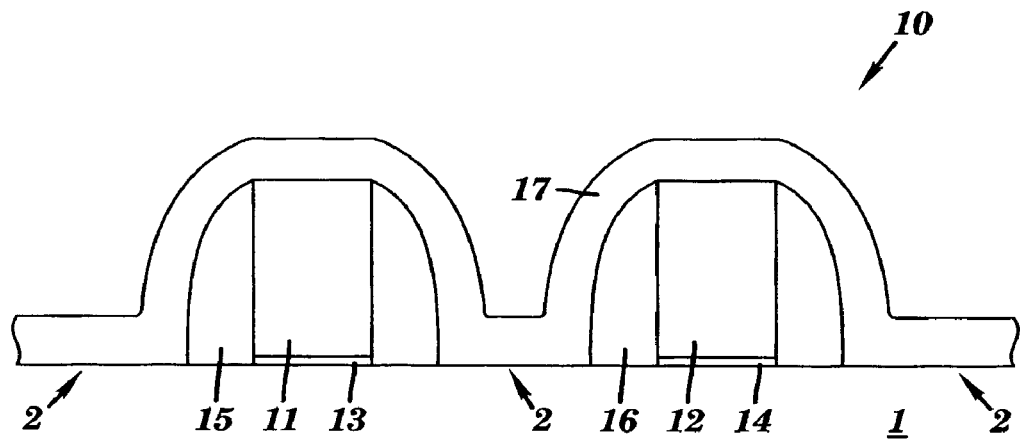
FIG. 1A is a schematic illustration in cross-section view of a pair of typical FET gate structures, with a layer of silicide-forming metal deposited thereon.
Figure 1B:
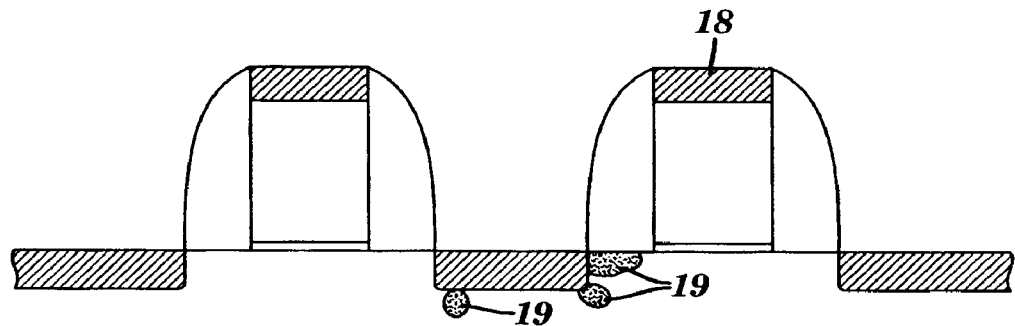
FIG. 1B is a schematic illustration of nickel silicide formed in the gate structure of FIG. 1A, where pipe defects are present.
Figure 2A:
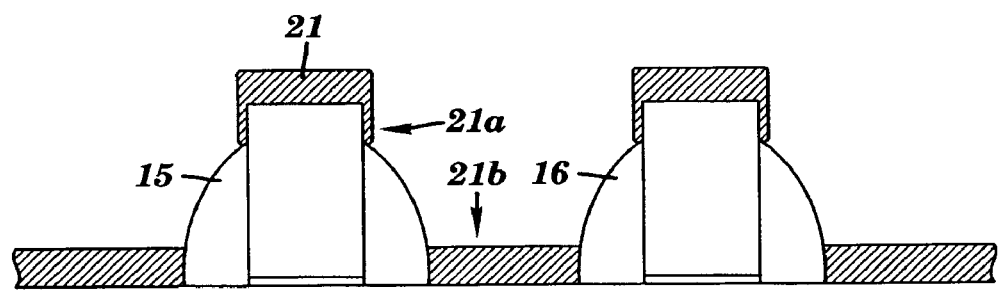
FIG. 2A shows a profile of metal deposited on a pair of gate structures using a collimated (directional) process.
Figure 2B:
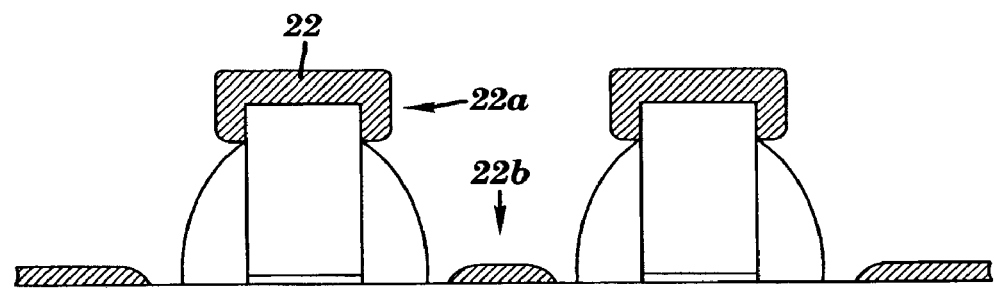
FIG. 2B shows a profile of metal deposited on a pair of gate structures using a non-collimated (non-directional) process.
Figure 3A:
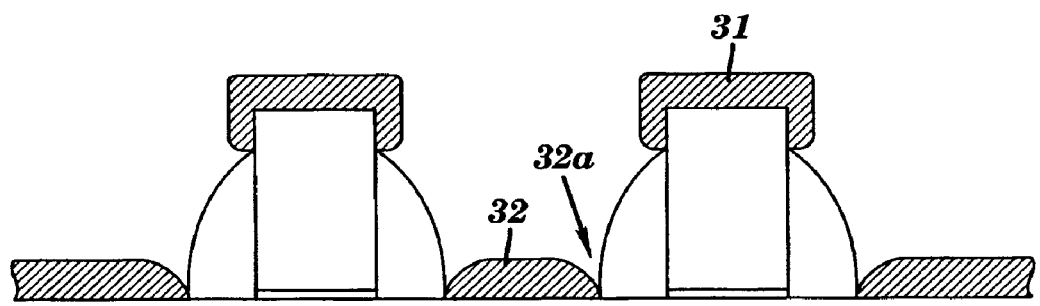
FIG. 3A shows a profile of deposited metal on a pair of gate structures, where the deposition process is performed in accordance with an embodiment of the present invention.

A nickel deposition process according to the invention integrates directional and non-directional deposition processes. FIG. 3A shows a profile of deposited nickel after the nickel is removed from the surface of the spacers. Non-directional deposition is used to cover the top and upper sidewalls of the gate structures with nickel 31 at a desired thickness; directional deposition is used to ensure that metal 32 in the source/drain regions has an adequate thickness (particularly between two neighboring gate structures). It should be noted that as a result of the directional deposition, the metal covering the source/drain region meets and is continuous with the surface of the spacer (contrast FIGS. 2B and 3A). Because deposition in the non-directional process is less efficient on the substrate between the gates than on top of the gate structure, the thickness of metal 32 is generally less than the thickness of metal 31.

Figure 2C:
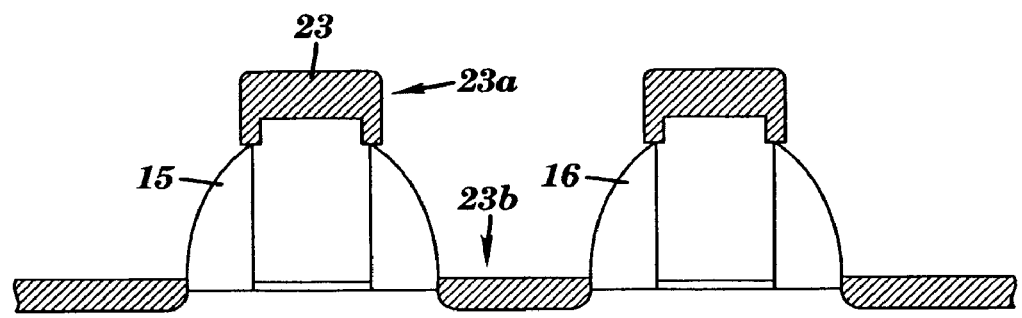
FIG. 2C shows a profile of silicide formed in a pair of gate structures after metal deposition using a collimated (directional) process.
Figure 2D:
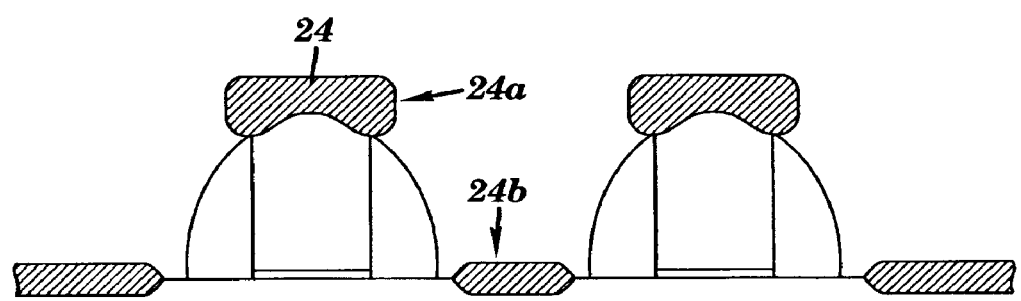
FIG. 2D shows a profile of silicide formed in a pair of gate structures after metal deposition using a non-collimated (non-directional) process.
Figure 3B:
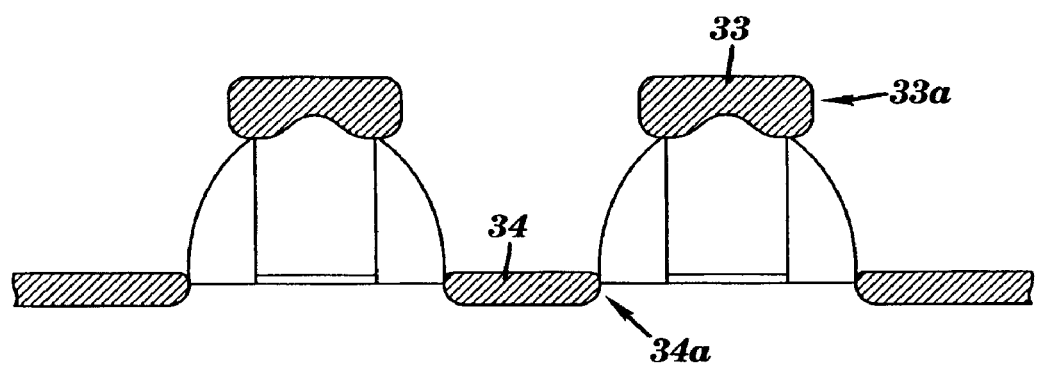
FIG. 3B shows a profile of silicide formed in a pair of gate structures after the metal deposition illustrated in FIG. 3A.

FIG. 3B illustrates the resulting silicide after heat treatment of the nickel of FIG. 3A. The non-directional deposition ensures formation of a thick silicide on the side of the gate (region 33a; compare region 24a in FIG. 2D). The directional deposition results in silicide coverage of the substrate in the source/drain regions (region 34; compare region 23b in FIG. 2C). The amount of directional deposition is controlled so that the nickel thickness is reduced adjacent to the spacers (region 32a in FIG. 3A). This results in a reduced thickness of silicide at the edge of the gate (region 34a; compare FIG. 2C), which in turn makes it less probable that pipe defects will form.

A silicide formed from metal deposited according to the invention therefore has a lower gate polysilicon sheet resistance, and a lower density of pipe defects, than a silicide formed from metal deposited in a solely directional process. In addition, a silicide formed from metal deposited according to the invention has a lower source/drain contact resistance than a silicide formed from metal deposited in a solely non-directional process.

Figure 4:
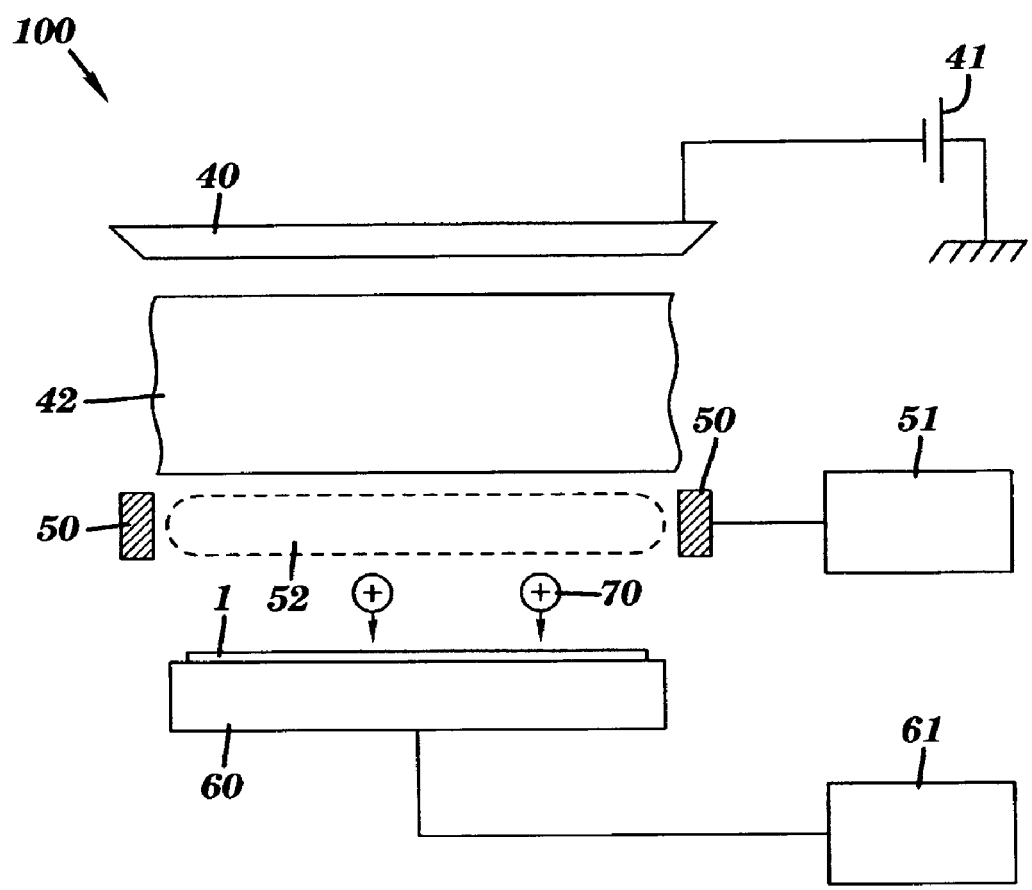
FIG. 4 is a schematic illustration of a metal deposition apparatus in accordance with another embodiment of the present invention.

A deposition chamber 100 in which a process according to the invention may be performed is schematically illustrated in FIG. 4. (FIG. 4 is a cross-sectional view through the center of the substrate.) A metal target 40 is positioned over the substrate 1 which is located on substrate holder 60; in present-day manufacturing the substrate is generally a 300 mm diameter silicon wafer and is held in a wafer chuck. The target is connected to a DC power supply 41. In this embodiment, the target 40 is a planar nickel target and the DC power is in the range 500 W-5 kW. (A different shape of target, such as a dome, inverted cup, etc. may also be used.) A plasma 42 is formed (typically from Ar gas) between the target and the substrate; plasma bombardment of the target causes removal of material which travels toward the substrate. Non-directional deposition thus occurs on the substrate as in a conventional deposition tool.

An annular electrode, such as a ring 50 of nickel, is positioned between the target and the substrate. The electrode may also be a ring made of stainless steel coated with Ni, or be a nickel wire screen or Ni cylinder. Ring 50 is connected to RF generator 51; when generator 51 is operating, a secondary plasma 52 is formed in the interior of the ring. RF generator 51 typically has a frequency of 1 to 4 MHz and delivers power in the range 200 W-2000 W. The secondary plasma 52 serves to increase the density of positive nickel ions which may be attracted to the substrate surface. The ring also serves as an aperture for collimating Ni atoms traveling from the target 40 to the substrate 1.

Another RF generator 61 is connected to the wafer chuck 60; this generator is used to bias the wafer so that nickel ions 70 are attracted to the substrate in a direction normal to the substrate. RF generator 61 delivers power in the range 0-800 W. The operating frequency of RF generator 61 is typically 13.56 MHz but may also be a few MHz (e.g. about 2 MHz).

In the first step of the integrated nickel deposition process, generators 51 and 61 are both turned off. Accordingly, the tool operates in a conventional mode and causes non-directional deposition on the gate structures (in particular, coverage of the side walls of the gate structures). This initial metal deposition also serves to make the wafer less susceptible to charging damage in subsequent steps.

In the second step of the deposition process, RF generators 51 and 61 are turned on, causing directional deposition of metal on the substrate. It will be appreciated that in a low-pressure deposition chamber, metal ions 70 are drawn to the substrate in a straight path, so that metal may be deposited in high-aspect-ratio structures (e.g. at the bottom of a trench, or on the substrate surface between neighboring gates). The directional deposition results in adequate metal coverage, and hence adequate silicide coverage, on the substrate between the gates.

Alternatively, directional metal deposition may be performed for a brief period at the beginning of the process, to ensure metal coverage near the spacers (e.g. region 32a as shown in FIG. 3A) before non-directional metal deposition begins.

The process may be optimized by varying one or more of the operating parameters of the tool. These include the total process time; the time the RF generators are on (directional deposition time); the ratio between directional deposition time and total time; the gas pressure in either the non-directional or the directional deposition step; and the power delivered by one or more of the RF generators. The overall process may be viewed as having a variable degree of directionality (or a variable degree of collimation of the metal deposition), which in turn affects the density of silicide pipe defects. The pipe defect density is also influenced by the substrate temperature, the composition of the alloy being deposited, and the post-deposition annealing conditions.

The above-described deposition process is particularly applicable to deposition on FET gate structures. More generally, the process may be advantageously used in various situations where a metal is to be deposited in a feature with a high aspect ratio (e.g. a trench where the depth of the trench exceeds its width by a factor of about 2 or more). Varying the degree of collimation of the deposition ensures that the bottom of the feature is covered with metal, while the pipe defect density in a subsequently formed silicide is controlled.

The metal deposition process and tool described above may be advantageously used to deposit nickel in order to form nickel silicide. It will be appreciated that the process and tool may be adapted for other silicide-forming metals, e.g. Ni alloys, Ti, W, Mo, Co, Pt, Nb and alloys thereof.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A structure formed on a substrate, comprising regions of metal silicide, wherein
   in a first region the metal silicide is disposed on a top of the structure and on an adjacent sidewall thereof;
   in a second region the metal silicide is disposed on the substrate adjacent to the sidewall so that a top surface of the metal silicide in the second region is higher than a top surface of said substrate and in contact with a surface of the sidewall; and
   a height of the top surface of the metal silicide in the second region decreases with decreasing distance from the sidewall.

2. A structure according to claim 1, wherein the regions of metal silicide are discontinuous.

3. A structure according to claim 1, wherein in the first region, a thickness of the metal silicide on the sidewall is substantially equal to a thickness on the top.

4. A structure according to claim 1, wherein the metal silicide in the first region is characterized by a first thickness and the metal silicide in the second region is characterized by a second thickness less than the first thickness.

5. A structure according to claim 1, wherein the metal in the metal silicide is selected from the group consisting of Ni, Ti, W, Mo, Co, Pt, Nb and alloys thereof.

6. An FET gate structure formed on a substrate, comprising:
   a portion of gate material having a top and a sidewall;
   a spacer adjacent the sidewall;
   a first region of metal silicide on top of the gate material; and
   a second region of metal silicide on the substrate and in contact with the spacer, said second region of metal silicide having a top surface that is higher than a top surface of said substrate,
   wherein
      the first region and the second region are discontinuous, and
      a height of the top surface of the metal silicide in the second region decreases with decreasing distance from the spacer.

7. An FET gate structure according to claim 6, wherein the metal silicide in the first region is characterized by a first thickness and the metal silicide in the second region is characterized by a second thickness less than the first thickness.

8. An FET gate structure according to claim 6, wherein the metal in the metal silicide is selected from the group consisting of Ni, Ti, W, Mo, Co, Pt, Nb and alloys thereof

9. An FET gate structure according to claim 6, wherein the spacer is adjacent a lower portion of the sidewall, and the first region of metal silicide includes an upper portion of the sidewall.

10. An FET gate structure according to claim 6, wherein in the first region, a thickness of the metal silicide on the sidewall is substantially equal to a thickness on the top.

11. An FET gate structure according to claim 6, wherein the gate material has a lateral dimension not greater than about 65 nm.

* * * * *